(12) United States Patent  (10) Patent No.: US 8,125,154 B2
Hui et al.  (45) Date of Patent: Feb. 28, 2012

(54) AUTOMATIC LAMP DETECTION METHOD AND OPTIMAL OPERATION FOR FLUORESCENT LAMPS

(75) Inventors: Shu Yuen Ron Hui, New Territories (HK); Leung Ming Lee, New Territories (HK)

(73) Assignee: City University of Hong Kong, Kowloon (HK)

( * ) Notice: Subject to any disclaimer, the term of this patent is extended or adjusted under 35 U.S.C. 154(b) by 531 days.

(21) Appl. No.: 12/181,935

(22) Filed: Jul. 29, 2008

(65) Prior Publication Data

US 2010/0026188 A1  Feb. 4, 2010

(51) Int. Cl.
 *H01J 13/46* (2006.01)
(52) U.S. Cl. ......... 315/46; 315/49; 315/209 R; 315/291; 315/312
(58) Field of Classification Search .................. 315/291, 315/297, 307–311, 312–326, 224, 209 R, 315/46, 49–54, 64–69
See application file for complete search history.

(56) References Cited

U.S. PATENT DOCUMENTS

6,081,077 A * 6/2000 Canova et al. ................ 315/307
(Continued)

*Primary Examiner* — Tuyet Thi Vo
(74) *Attorney, Agent, or Firm* — Heslin Rothenberg Farley & Mesiti, P.C.

(57) ABSTRACT

There is provided a method that can detect the lamp type of fluorescent lamps and operate the lamp at the appropriate lamp power. The proposed method involves the classification of lamp characteristics of existing fluorescent lamps and the use of logic detection method such as a fuzzy logic detection and control technique to zoom into the right type of lamp. The information used in the lamp detection includes (1) lamp filament/electrode resistance, (2) lamp voltage and (3) lamp current. These three pieces of information can be used to select the appropriate fluorescent lamp type so that the control gear can operate the lamp at the right rated power. The importance of this invention can lead to a universal electronic ballast that can detect and operate all fluorescent lamps commonly available. It can also be used in a limited capacity to control a limited range of lamps.

10 Claims, 10 Drawing Sheets

U.S. PATENT DOCUMENTS

| | | | |
|---|---|---|---|
| 6,359,387 B1 * | 3/2002 | Giannopoulos et al. | 315/46 |
| 6,414,449 B1 | 7/2002 | Hui et al. | |
| 7,589,472 B2 * | 9/2009 | Keith et al. | 315/94 |
| 2011/0062879 A1 * | 3/2011 | Yadlapalli et al. | 315/250 |

* cited by examiner

| T8 Lamp (W) | Philips (TLD'Standard) | | GEC (KRYPTON) | | Thorn (Polylux &Plusline) | | Sylvania (Standard) | |
|---|---|---|---|---|---|---|---|---|
| | Lamp Voltage (Vrms) | Lamp Current (Arms) | Lamp Voltage (Vrms) | Lamp Current (Arms) | Lamp Voltage (Vrms) | Lamp Current (Arms) | Lamp Voltage (Vrms) | Lamp Current (Arms) |
| 18 | 59 | 0.36 | 57 | 0.37 | 57 | 0.37 | 57 | 0.37 |
| 30 | 98 | 0.36 | - | - | - | - | 96 | 0.365 |
| 36 | 103 | 0.44 | 103 | 0.43 | 103 | 0.43 | 103 | 0.43 |
| 58 | 111 | 0.67 | 110 | 0.67 | 110 | 0.67 | 110 | 0.67 |
| 70 | 132 | 0.69 | 128 | 0.70 | 128 | 0.70 | - | - |

| T5 Lamp (W) | Philips | | GE | |
|---|---|---|---|---|
| | Lamp Voltage (Vrms) | Lamp Current (Arms) | Lamp Voltage (Vrms) | Lamp Current (Arms) |
| T5 – High Efficiency | | | | |
| 14 | 82 | 0.17 | 86 | 0.17 |
| 21 | 123 | 0.17 | 126 | 0.17 |
| 28 | 167 | 0.17 | 166 | 0.17 |
| 35 | 209 | 0.17 | 205 | 0.17 |
| T5 – High Output | | | | |
| 24 | 75 | 0.30 | 77 | 0.30 |
| 39 | 112 | 0.34 | 118 | 0.34 |
| 49 | 195 | 0.26 | 195 | 0.26 |
| 54 | 135 | 0.46 | 135 | 0.46 |
| 80 | 145 | 0.56 | 152 | 0.56 |

Table 1

FIG. 2

T8 Lamps

| Lamp (W) | Philips (TLD Standard) Lamp Voltage (V rms) | GEC (KRYPTON) Lamp Voltage (V rms) | Thorn (Polylux & Plustus) Lamp Voltage (V rms) | Sylvania (Standard) Lamp Voltage (V rms) | Voltage Variance Voltage (V rms) | Voltage Variance Voltage (%) |
|---|---|---|---|---|---|---|
| 18 | 59 | 57 | 57 | 57 | 2 | 3.39 |
| 30 | 98 | - | - | 96 | 2 | 2.04 |
| 36 | 103 | 103 | 103 | 103 | 0 | 0 |
| 58 | 111 | 110 | 110 | 110 | 1 | 0.90 |
| 70 | 132 | 128 | 128 | - | 4 | 3.03 |

T5 Lamps

| T5 Lamp (W) | Philips Lamp Voltage (V rms) | GE Lamp Voltage (V rms) | Volt. Variance Voltage (V rms) | Volt. Variance Voltage (%) |
|---|---|---|---|---|
| T5 – High Efficiency | | | | |
| 14 | 82 | 86 | 0 | -4.9 |
| 21 | 123 | 126 | 0 | -2.3 |
| 28 | 167 | 166 | 0 | 0.6 |
| 35 | 208 | 205 | 0 | 1.9 |
| T5 – High Output | | | | |
| 24 | 75 | 77 | -2 | -2.7 |
| 39 | 115 | 118 | -3 | -2.6 |
| 49 | 195 | 195 | 0 | 0 |
| 54 | 135 | 135 | 0 | 0 |
| 80 | 145 | 152 | 0 | -4.8 |

Table 2

FIG. 3

| Lamp (W) | Lamp Power at High Freq. (>20KHz) (W) | Lamp Voltage (V_rms) |
|---|---|---|
| T8 | | |
| 18 | 15.5 | 59 |
| 30 | 25.8 | 98 |
| 36 | 30.9 | 103 |
| 58 | 49.9 | 111 |
| 70 | 60.2 | 132 |
| T12 | | |
| 20 | 17.2 | 57 |
| 30 | 25.8 | 84 |
| 40 | 34.4 | 103 |
| 65 | 55.9 | 110 |
| T5 – High Efficiency | | |
| 14 | 14 | 82 |
| 21 | 21 | 123 |
| 28 | 28 | 167 |
| 35 | 35 | 209 |
| T5 – High Output | | |
| 24 | 24 | 75 |
| 39 | 39 | 115 |
| 49 | 49 | 195 |
| 54 | 54 | 135 |
| 80 | 80 | 145 |

Table 3

FIG.4

| Lamp (W) | Lamp Voltage ($V_{RMS}$) |
|---|---|
| T8-36W | 103 |
| T12-40W | 103 |
| T8-58W | 111 |
| T12-110W | 110 |
| T5-HO 39W | 115 |
| T8-70W | 132 |
| T5-HO 54W | 135 |

Table 4

| Lamp (W) | Cold Electrode Resistance (Ω) | Heat Electrode Resistance (Ω) |
|---|---|---|
| T8 | | |
| 18 | 2.5 | 11.3 |
| 30 | 2.5 | 11.3 |
| 36 | 2.5 | 11.3 |
| 58 | 2 | 9.0 |
| 70 | 2 | 9.0 |
| T12 | | |
| 20 | 3 | 13.5 |
| 30 | 3 | 13.5 |
| 40 | 3 | 13.5 |
| 65 | 3 | 13.5 |
| T5 – High Efficiency | | |
| 14 | 9 | 40.5 |
| 21 | 9 | 40.5 |
| 28 | 9 | 40.5 |
| 35 | 9 | 40.5 |
| T5 – High Output | | |
| 24 | 3 | 13.5 |
| 39 | 3 | 13.5 |
| 49 | 4 | 18.0 |
| 54 | 2 | 9.0 |
| 80 | 2 | 9.0 |

Table 6

AUTOMATIC LAMP DETECTION METHOD AND OPTIMAL OPERATION FOR FLUORESCENT LAMPS

FIELD OF THE INVENTION

This invention relates to a method and apparatus for the detection of the type of automatic lamp and the selection of optimal operating conditions.

BACKGROUND OF THE INVENTION

A number of new energy-efficient fluorescent lamps such as T5 (high-efficiency) and T5 (high-output) lamps have been launched in the past few years and a large number of different fluorescent lamp types are available in the market. However, in practice a specific ballast design must be made for each lamp type and this means that ballast manufacturers must design many different ballasts and the consumers must choose the right ballasts for their fluorescent lamps. Selecting the wrong ballast may mean that the lamp will either not light at all, or may be operated under less than optimal conditions, may be damaged or may even be unsafe. However, if a universal electronic ballast can be designed so that it can detect and operate a wide range of fluorescent lamp types, then the ballast manufacturers can produce a common electronic ballast that can operate a wide range of lamps and the consumers do not have to buy and stock a wide range of lamp ballasts. Even if such a ballast could only be used for a limited number of lamps, it could still reduce the number of ballast products required.

PRIOR ART

U.S. Pat. No. 6,414,449 discloses a ballast that can automatically detect and properly operate T8 and T12 fluorescent lamps at the rated power based on lamp (i) voltage and (ii) current detection. However, with the introduction of T5 high-efficiency (HE) and T5 high-output (HO) lamps, as will be seen further in the description below it will be shown that there are many overlapping lamp characteristics that mean that it is no longer possible to detect all T5, T8 and T12 lamps by simply monitoring the steady-state lamp voltage and current only.

Figure 1A:
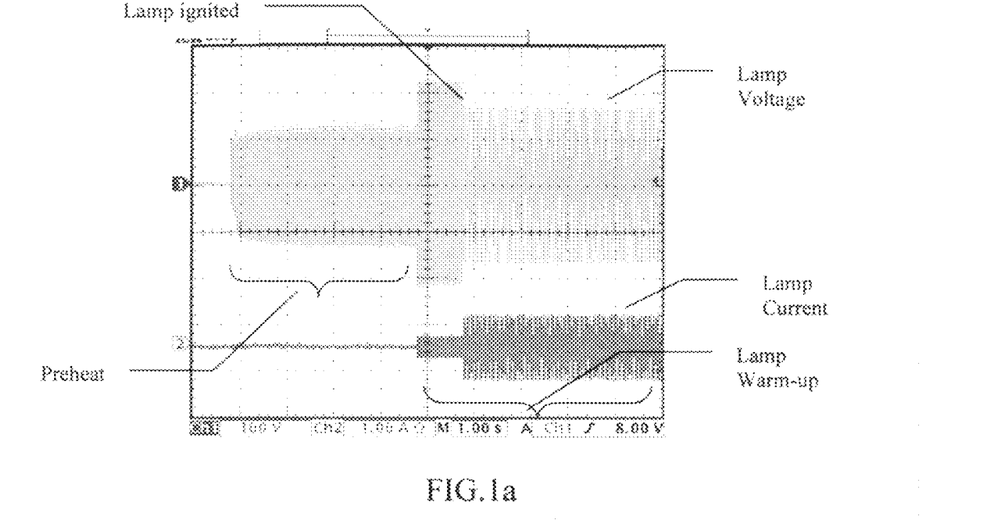
FIGS. 1a and 1b show typical fluorescent lamp ignition characteristics.
Figure 1B:
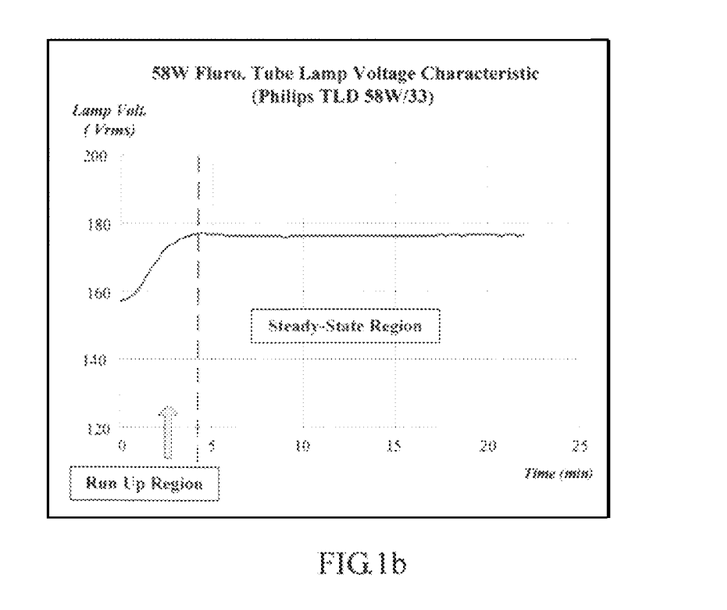

A typical lamp voltage characteristic of a T8 58 W lamp after ignition is shown in FIG. 1a and FIG. 1b. Generally, a voltage less than the ignition voltage is applied across the electrodes for a small time (0.5-1.0 s) to preheat the lamp filaments for thermionic emission. Then a high voltage of higher than a kilo-voltage is applied across the electrodes of the lamp to cause the lamp arc to strike. The lamp usually takes a few minutes to warm up and then it will reach its steady-state operation at which the lamp voltage and current will reach their rated values respectively. After ignition, the voltage across the lamp falls to a lower operating voltage. Under steady-state operating conditions at rated power, the lamp voltage and current will remain almost constant at the respective rated values as shown in FIG. 1b. The actual power drawn by the fluorescent lamp is simply represented by the product of RMS value of lamp voltage and current.

Figure 2:
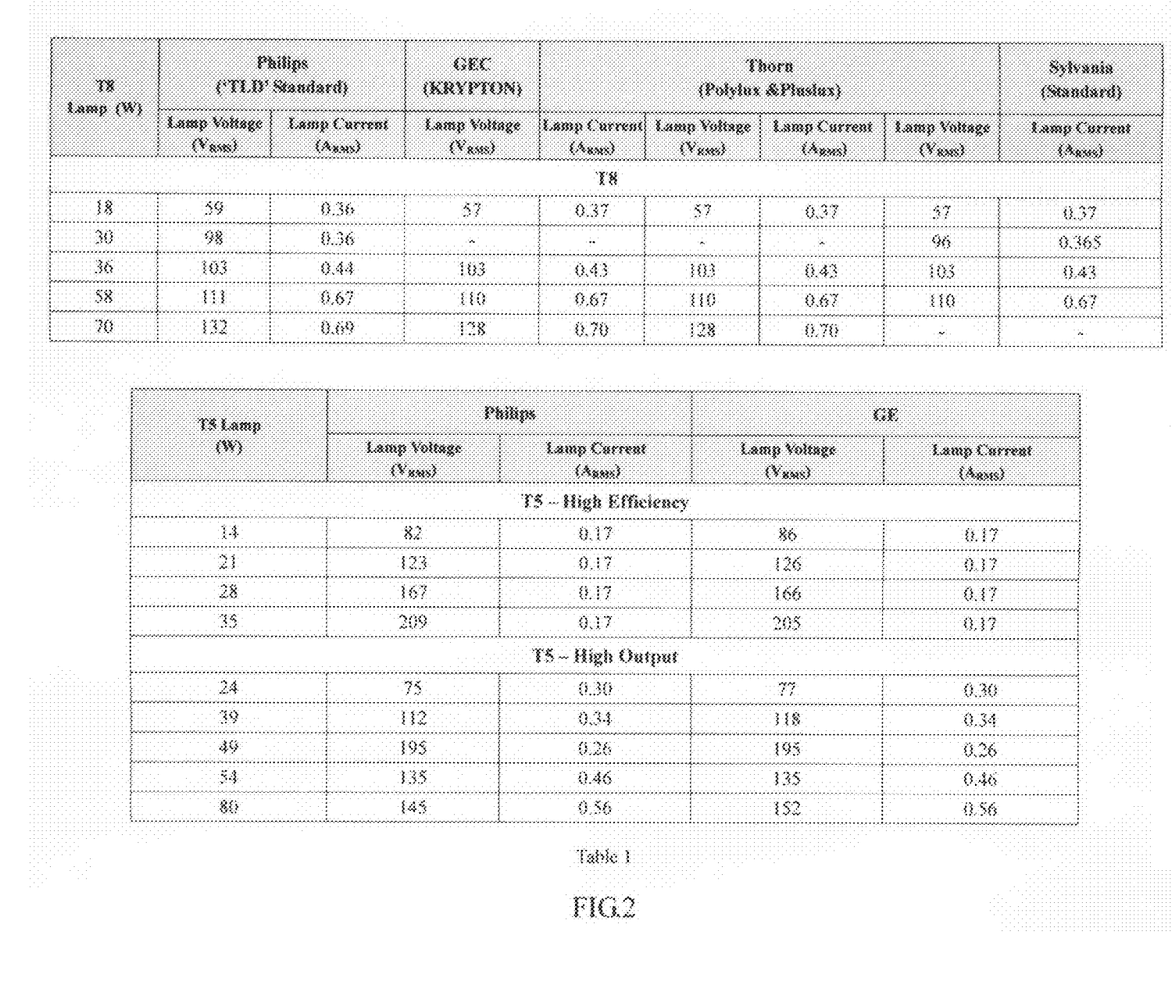
FIGS. 2 to 5 show tables displaying electrical characteristics of various known fluorescent lamps.

Table 1 in FIG. 2 shows typical rated lamp voltage and current of T5 and T8 lamps of several lamp manufacturers. It can be seen that, for each lamp type of the same rated power, the lamp voltage and current are almost identical for these popular standard fluorescent lamps.

As shown in the Table 1 and with reference to FIGS. 6 and 7, the relationship of lamp power and lamp current is observed as follows: (a) The actual lamp currents of T5-HE lamps are identical and some T8 & T12 lamps have almost identical currents. This means that these lamp types cannot be differentiated from the steady-state lamp currents alone; (b) Regarding the lamp power of 18 W and 30 W and the full range of T5-HE, the lamp currents are identical (i.e. 0.17 A). In other words, T5-HE lamps cannot be differentiated by monitoring the lamp current alone. Also, current detection cannot easily distinguish Thorn and GEC (58 W & 70 W) lamps because their steady-state lamp currents are very close (0.67 A and 0.69 A). Therefore, lamp current sensing alone is insufficient for lamp detection in a universal ballast.

Figure 3:
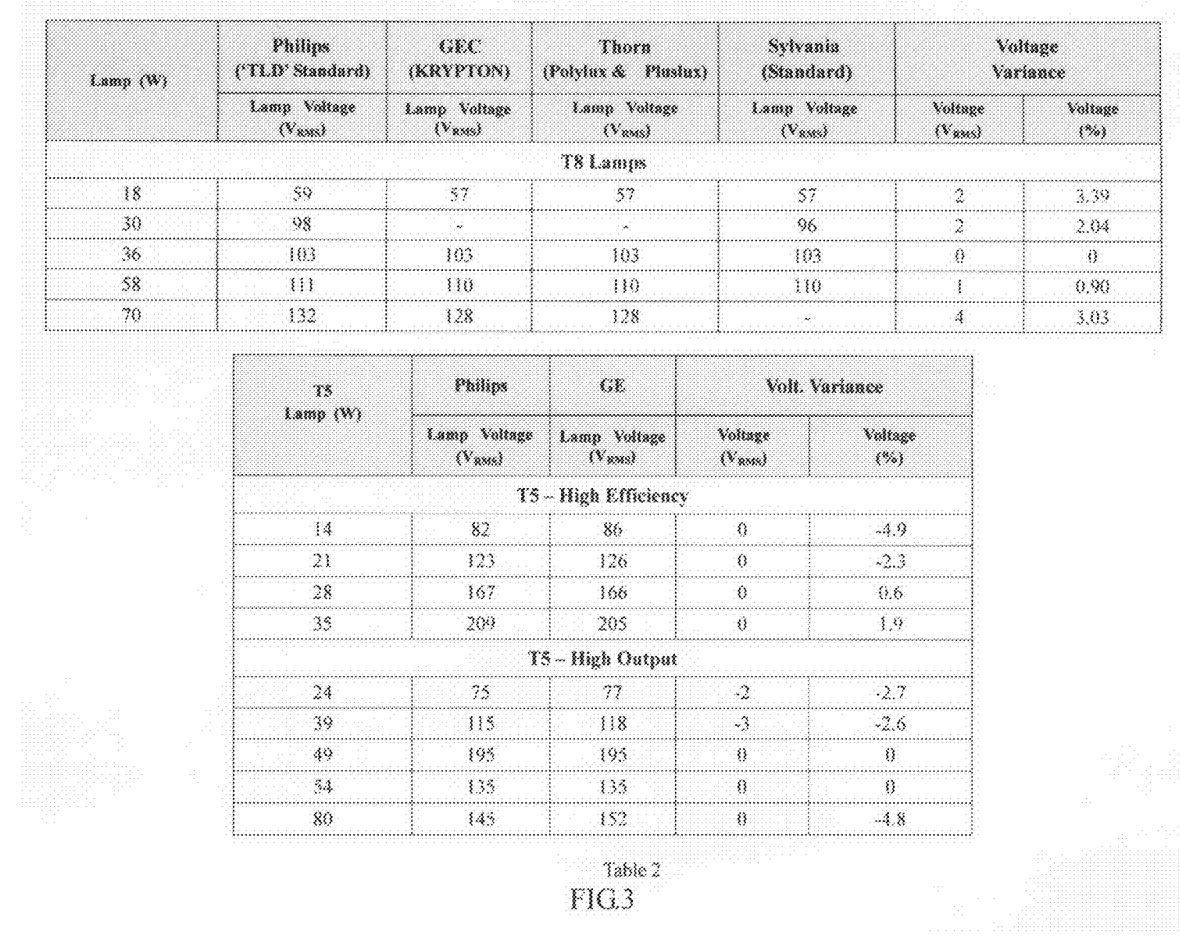
Figure 4:
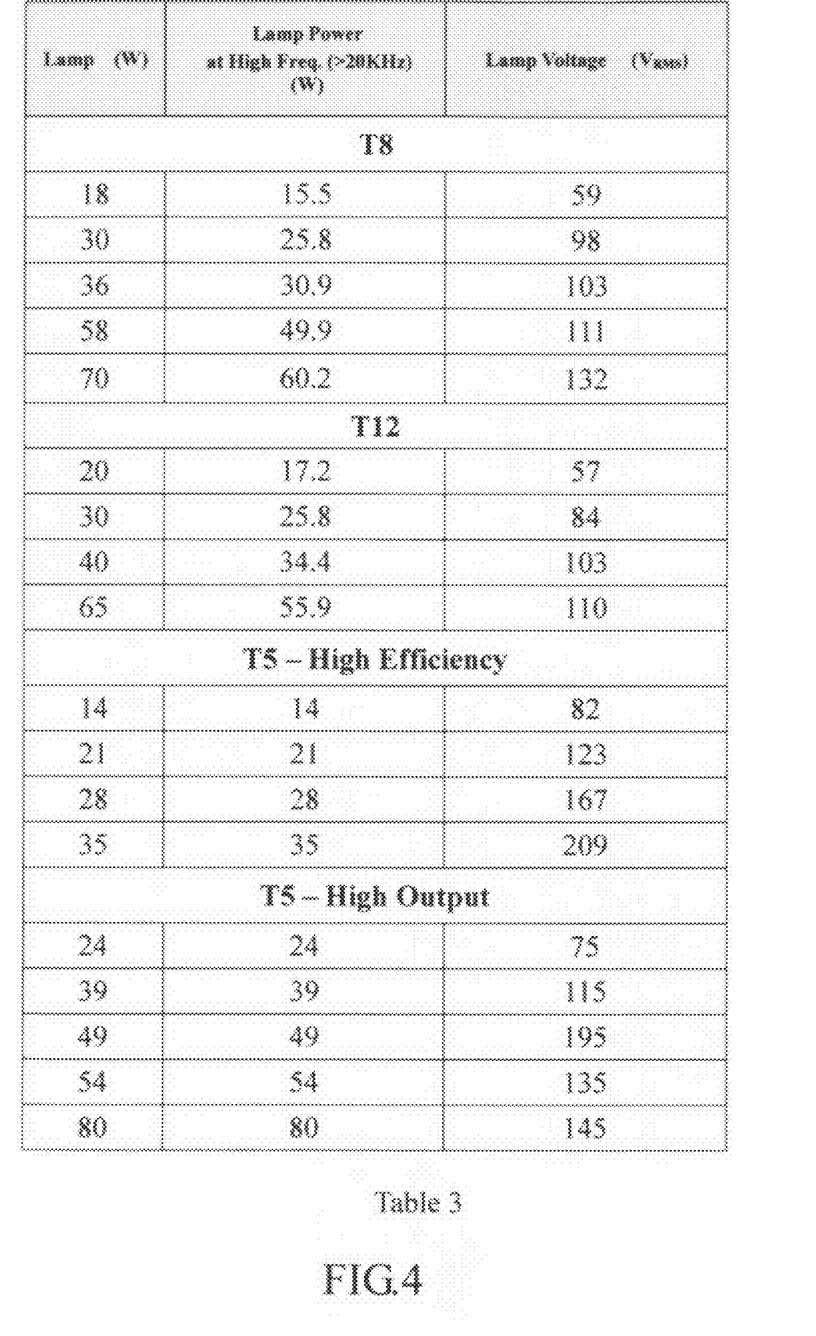
Figure 5:
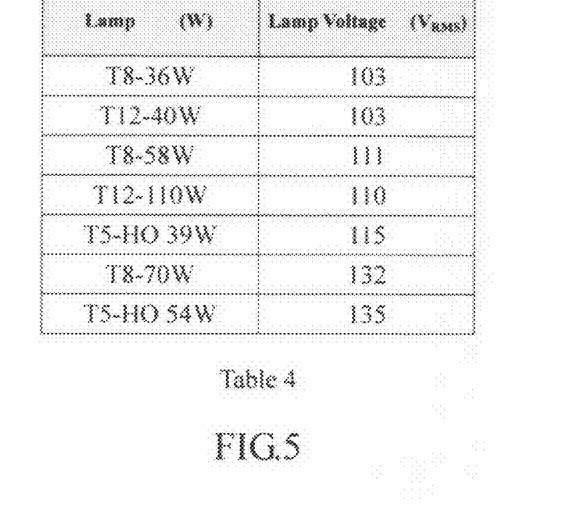

Table-1 is now reconstructed as Table-2 shown in FIG. 3, in which lamp voltages are considered. The lamp power values stated in Table-2. are values operating at the line voltage e.g. 50 Hz. At the high operating frequency, the lamp power is less than the line frequency [3] as shown in Table-3.

Figure 6:
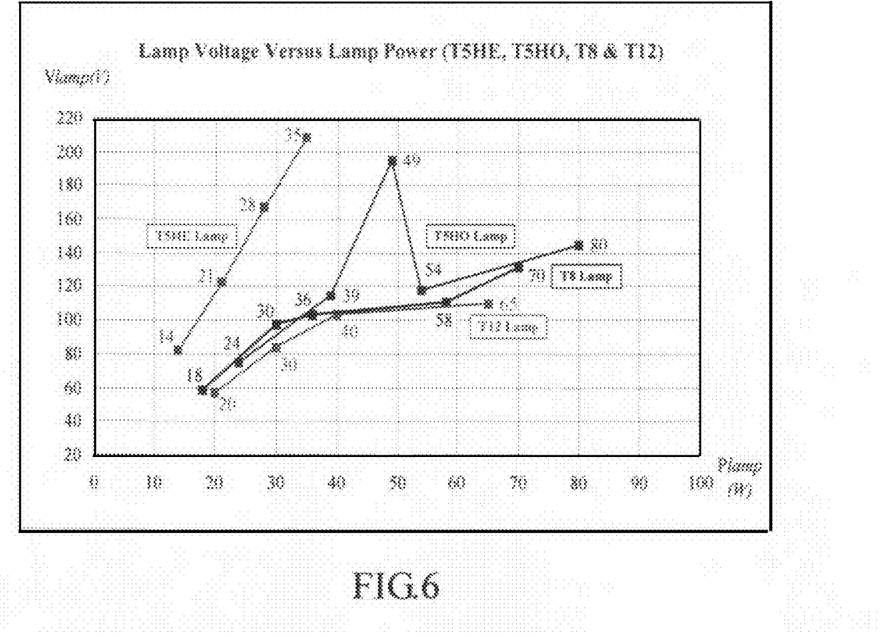
FIG. 6 is a plot showing lamp voltage (H.F.) versus lamp power at high frequencies for a number of known lamps.
Figure 7:
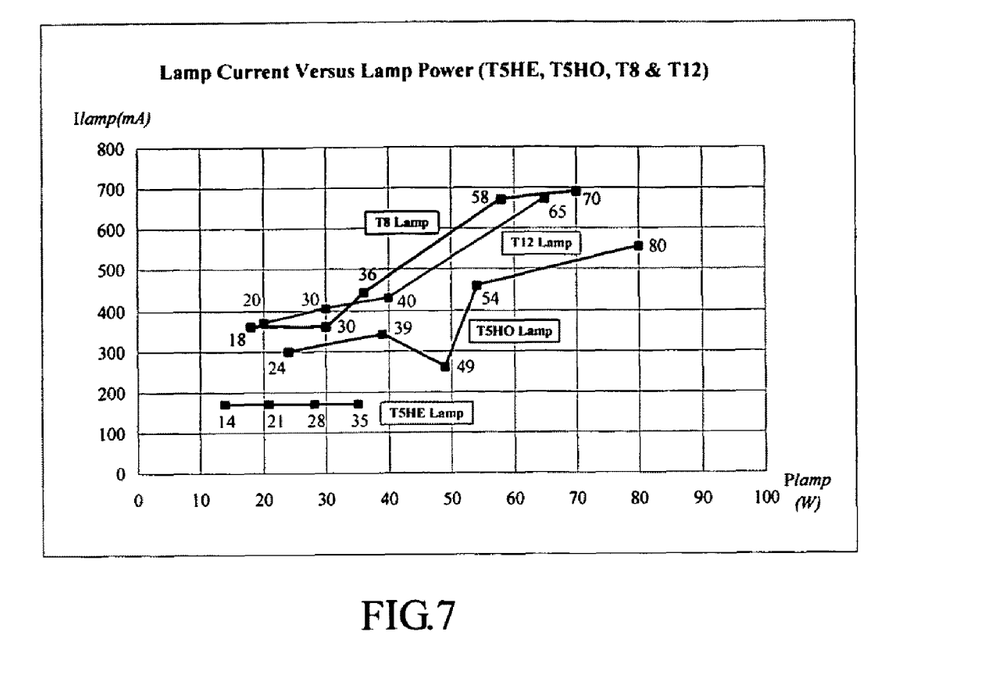
FIG. 7 is a plot showing lamp current versus lamp power for a number of known lamps.

The results in Tables 2 and 3 can be seen graphically in FIG. 6. From Tables 2 to 4, it can be seen that the lamp voltage alone cannot be used to differentiate all lamp types, although it can be used to differentiate a majority of types of lamps. The reasons for this include: (a) Table 2 shows that the largest voltage variance among different lamp manufacturers is below 5%. This theoretical tolerance is acceptable even for the T5-HE 14 W lamps in which the lumen output will not increase obviously; (b) FIG. 2 shows that the lamp voltage versus lamp power characteristics of T5-HE are distinctively different from those of T5-HO, T8 and T12 lamps; (c) FIG. 2 also shows that T8 and T12 lamps and most of T5-HE lamps (except T5-HO 49 W lamps) have similar trends and these groups of lamps (but not all types of lamps) can be detected by monitoring the lamp voltage; (d) If all lamps under consideration are included, it can be seen from FIG. 6 that many lamps have lamp voltages falling within the narrow voltage range of 110V to 120V and so it is not possible to detect all lamp types based on lamp voltage detection only.

In short, the voltage monitoring method is a possible way to differentiate most (but not all) lamps. But for some lamps, such as T8-36 W, 58 W, 70 W, T12-40 W, 65 W, T5-HO 39 W, 54 W as listed in Table-4, it is observed that that lamp voltage difference is too small for lamp differentiation (less than 2.3% to the nearest lamps in the detection range). In order to detect these lamp types accurately, more information is required for the lamp type differentiation.

SUMMARY OF THE INVENTION

According to the present invention there is provided a method of detecting a fluorescent lamp type from a number of known lamp types, comprising the steps of:
(a) injecting a preheat current into the lamp filament,
(b) detecting the resistance of the filament,
(c) making a first determination of possible lamp type on the basis of the filament resistance,
(d) if the determination in step (c) is not definitive measuring the lamp voltage,
(e) making a second determination of possible lamp types on the basis of the filament resistance and the lamp voltage,
(f) if the determination in step (e) is not definitive measuring the lamp current, and
(g) making a third determination on the basis of the filament resistance, lamp voltage and lamp current.

In a preferred embodiment of the invention prior to step (f) the lamp is operated for a period of time sufficient for the lamp to reach a steady-state condition (eg 90 seconds at 31 kHz) and when the lamp is in the steady-state condition the lamp voltage is determined and a decision is made as to whether the lamp is of a high-voltage or low-voltage type.

Preferably the preheat current may be injected for from 1.5 to 3 seconds.

Preferably the determinations of steps (c), (e) and (g) are carried out by comparing said measured values with reference values for various lamp types. The method is preferably carried out by a control means, and the reference values are stored in a database accessible by the control means.

According to another aspect of the present invention there is provided an electronic ballast for a fluorescent lamp capable of detecting a fluorescent lamp type from a number of known lamp types, comprising: a micro-controller configured to make a determination of the lamp type based on a combination of lamp resistance, lamp voltage and lamp current.

According to a still further aspect of the present invention there is provided an electronic ballast for a fluorescent lamp capable of detecting a fluorescent lamp type from a number of known lamp types, comprising:
  (a) means for injecting a preheat current into the lamp filament,
  (b) means for detecting the resistance of the filament,
  (c) means for making a first determination of possible lamp type on the basis of the filament resistance,
  (d) means for measuring the lamp voltage,
  (e) means for making a determination of possible lamp types on the basis of the filament resistance and the lamp voltage,
  (f) means for measuring the lamp current, and
  (g) means for making a determination on the basis of the filament resistance, lamp voltage and lamp current.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

FIG. 1b shows a typical fluorescent lamp voltage characteristic with time. Two regions can be defined. In the run-up (or warm-up) region, the lighting level reaches 90% of maximum within a few minutes, and then it enters a steady-state region in which the fluctuation of the light output and lamp voltage is within a narrow range. Hence, if the electronic ballast can detect the lamp voltage during the steady state, and the operating point can be made to follow an appropriate lamp power curve as indicated in FIG. 6, the appropriate lamp current should be outputted to the fluorescent lamps automatically. As a result, the actual lamp power should match the rated power of the fluorescent lamp.

In preferred embodiments of the present invention the lamp electrode (filament) resistance, lamp voltage and lamp current are used to determine the lamp type and this enables a universal ballast to be realised for all or at least a wide range of fluorescent lamps, including T5 (HE & HO), T8 and T12 with different power ratings. Without loss of generality, a method for detecting all T5, T8 and T12 lamps is described in the following. However, the method can be used to detect a smaller range of lamp types if necessary.

Figure 8:
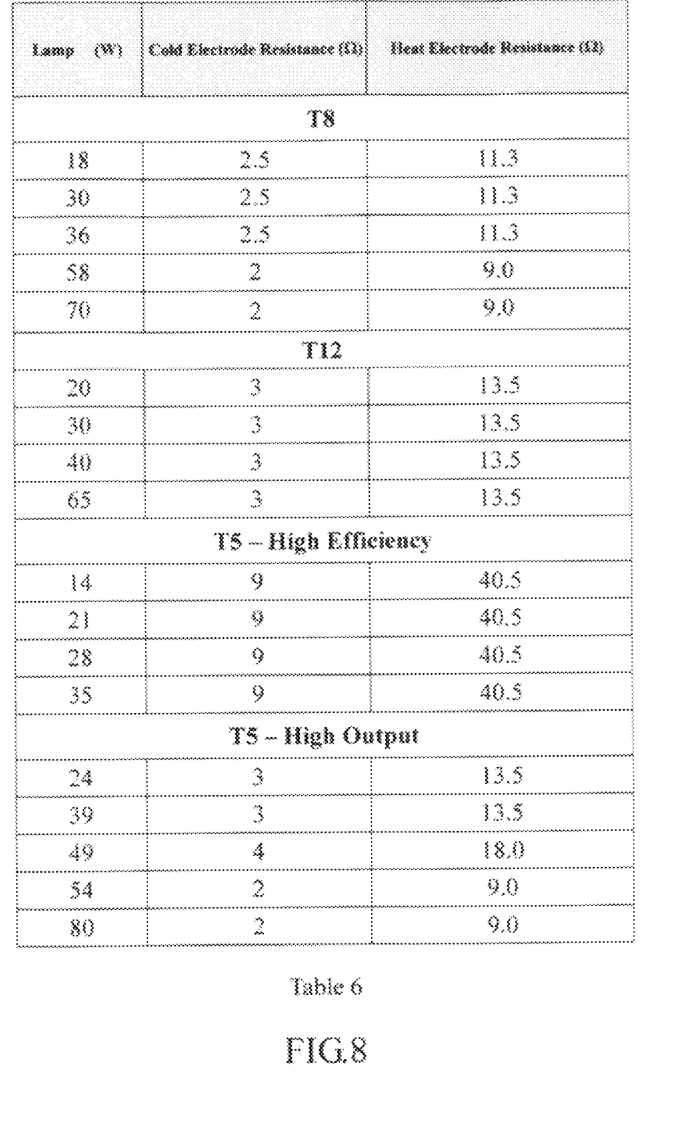
FIG. 8 is a table displaying electrical characteristics of various known fluorescent lamps.

In fluorescent lamps, the filaments are used to emit electrons during ignition and running. During preheat (before ignition), the filaments are heated by the appropriate preheat current. After the current begins to pass through it, the filament resistance will rise to up to about 4.5 times cold filament resistance. As recommended by manufacturers, the filament resistance should be exceeded fourfold where it is suitable for electrons thermionic emission. Otherwise, very high ignition voltage is required to ignite the lamp, leading to reduction of the lifetime of the lamps. As shown in Table 6 shown in FIG. 8, different types of lamps may have different filament resistance. If the filament resistance is known, some group of lamps, such as T5 high efficiency lamps (Heated Filament Resistance ~40.5Ω) and T5-HO 49 W (Heated Filament Resistance ·18Ω), can be detected. This is an important aspect of preferred embodiments of the present invention. It can been seen in particular that T5(HE) lamps have a higher electrode resistance. Thus, the detection of the T5-HE group can be easily achieved by the electrode resistance detection.

Without loss of generality, the lamp detection and operation approach of embodiments of the present invention can be implemented with the help of a fuzzy logic control together with an electronic ballast. In this example, memory such as EPROMs are used to stored the corresponding frequency codes for each type of lamps. These frequency codes are selected according to the decision of a fuzzy logic controller.

An important aspects of preferred embodiments of this invention is to use (i) the heated resistance of the lamp electrodes (filaments), (ii) lamp voltages and (iii) lamp currents to differentiate the lamp types. Based on modern intelligent control methods (such as fuzzy-logic control) and a pre-stored decision tree data file, the lamp types can be correctly identified with the help of an appropriate sequence of switching frequencies of the electronic ballasts.

There are three inputs to the fuzzy-logic controller (FLC): (i) lamp voltage, (ii) lamp current and (iii) hot resistance of filament, and these are chosen to provide information for making on-line decisions. The high lamp voltage must be stepped down and then converted to a low D.C. voltage analog signal by means such as an AC/DC voltage converter.

The function of hot resistance of filament ($R_h$) is to provide information for differentiating the T5HE ($R_h$>36Ω), Non-T5HE (inclusive of T5HO, T8 and T12 lamps ($R_h$<15Ω)) and T5HO-49 W (15Ω<$R_h$<36Ω) lamps. Therefore, the resistance values of hot filaments must be converted into a voltage signal, for example, by a resistance-to-voltage converter comprising a constant current source, a current-to-voltage (A/V) converter and an AC/DC voltage converter.

The output of FLC is a continuous rectangular wave signal with a controllable frequency. The frequency of this output signal varies according to the conclusions of an inference mechanism. In FLC, the reference lamp data inputs are predetermined and stored as data tables in a lamp database. Such frequency data will be used to control the switching frequency of the ballast inverter and consequently control the lamp power.

Figure 9:
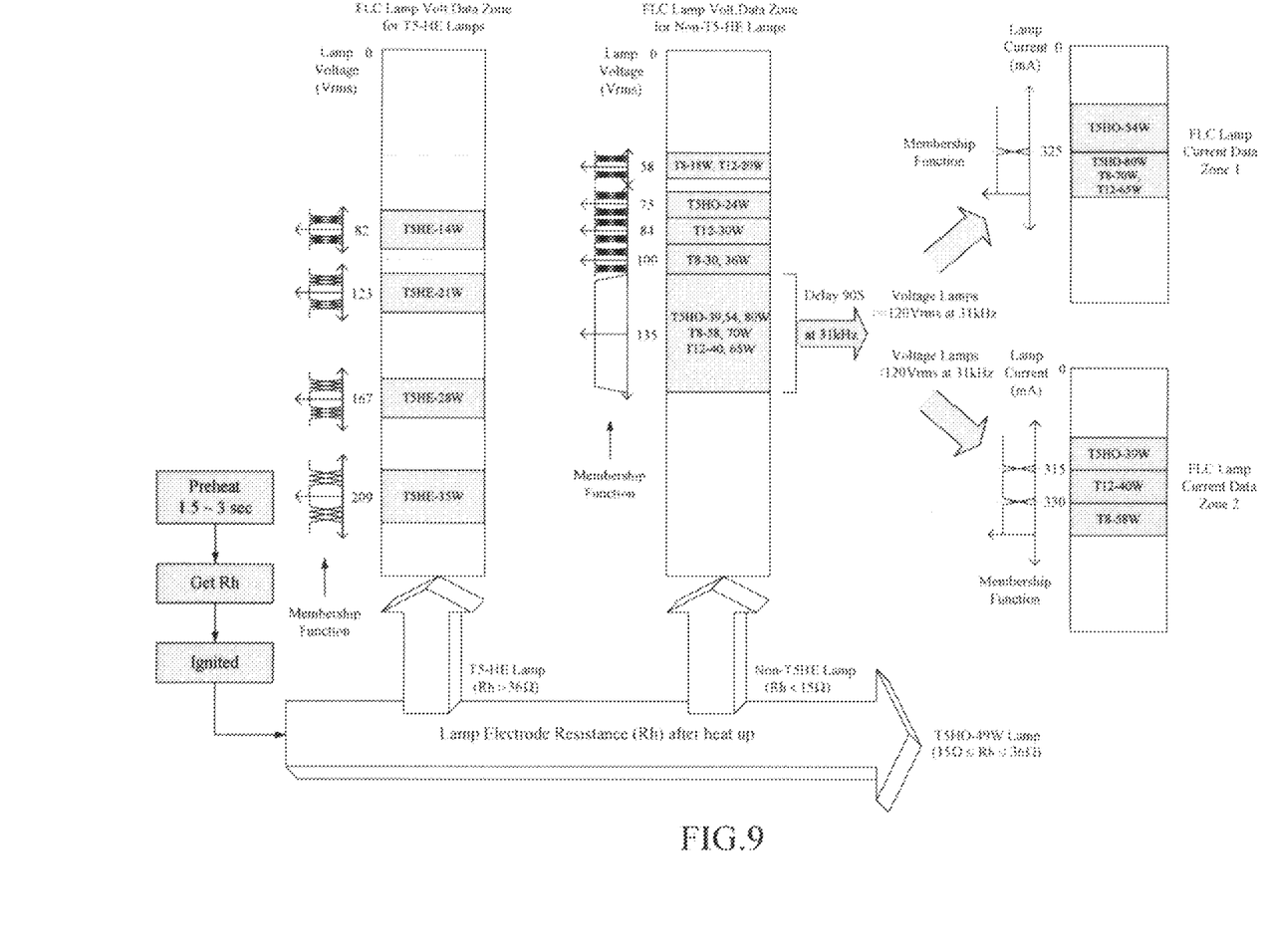
FIG. 9 shows a fuzzy control algorithm for a Universal Electronic Ballast.
Figure 10:
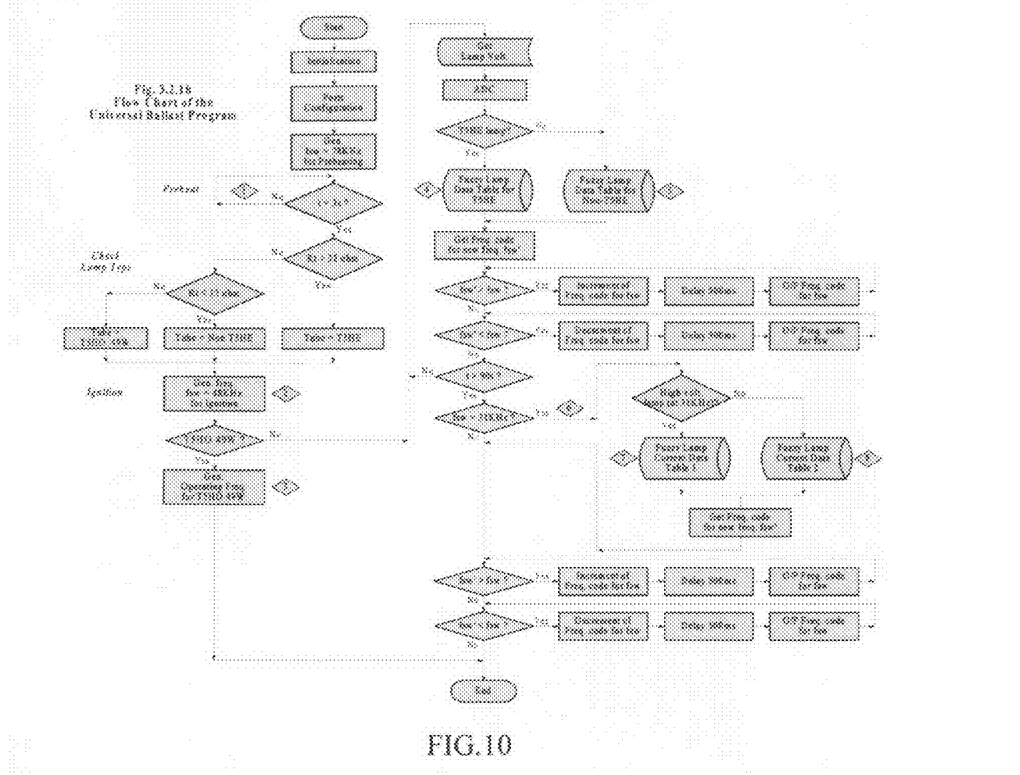
FIG. 10 is a flow chart of the lamp detection and operation method according to an embodiment of the invention.

FIG. 9 shows the lamp detection mechanism according to an embodiment of the invention and FIG. 10 shows the flow chart of the operation of the fuzzy-logic controlled electronic ballast. It is now assumed here that the electronic ballast is designed with a certain resonant tank circuit that can cover all tubular lamp types for the following discussion. For different operating frequencies, the electronic ballast can provide different power according to the lamp ratings.

As shown in FIG. 9, the lamp detection procedure is as follows:

The first step is to inject a preheat current into the lamp electrodes for a short "preheat period", typically 1.5 second to 3 seconds.

The heated electrode resistance is then sampled for the first stage of lamp differentiation.

If the heated electrode resistance is higher than 15Ω and less than 36Ω, then the lamp type must be T5HO-49 W lamp (which has a typical heated resistance of 18Ω.)

If the heated electrode resistance is higher than 36Ω, then the lamp must be of T5HE type. Then the fuzzy-logic controller will use the steady-state lamp voltage to differentiate various types of T5HE lamps.

If the heated electrode resistance is less than 15Ω, then the lamp is "non-T5HE" type. Non-T5HE lamps consist of many lamps. For relatively low-power lamps with power ratings less than 38 W (such as T8-18 W, T12-20 W, T5HO-24 W, T12-30 W and T8-36 W), their lamp voltages are relatively lower than those of the high-power lamps. They can be distinctly identified based on their lamp voltages using the fuzzy-logic controller. For non-T5HE lamps with rated power higher than 38 W, they can be further divided into two groups, namely high-voltage group and low-voltage group. Lamps of these two groups have similar current ratings and thus have to be separated by lamp voltage first and then by lamp current.

In order to further differentiate the high-voltage and low-voltage groups, the ballast in this example is operated at 31 kHz for a "delay time" of about 90 seconds. After such delay time, the lamp voltage reaches its steady-state value. If the lamp voltage is equal to or higher than 120 Vrms, then it is considered as a member of the high-voltage group. If not, then it belongs to the low-voltage group. After determination of the high-voltage or low-voltage groups, then they are differentiated by the fuzzy logic controller according to their current ratings.

It will thus be seen that by monitoring (either directly or indirectly) the lamp filament/electrode resistance as a third parameter, enough information is provided to enable all T5, T8 and T12 lamps to be distinguished. In embodiments of this invention, a methodology is presented to map and classify the characteristics of fluorescent lamps (based on T5, T8 and T12 lamps that are currently commercially available), and a lamp detection and control strategy is proposed. To generalize the method, a strategy is explained to detect T5, T8 and T12 lamps. However, the same methodology can be used to detect a smaller group of lamps such as T5 lamps only, or T5 and T8 lamps only.

Figure 11:
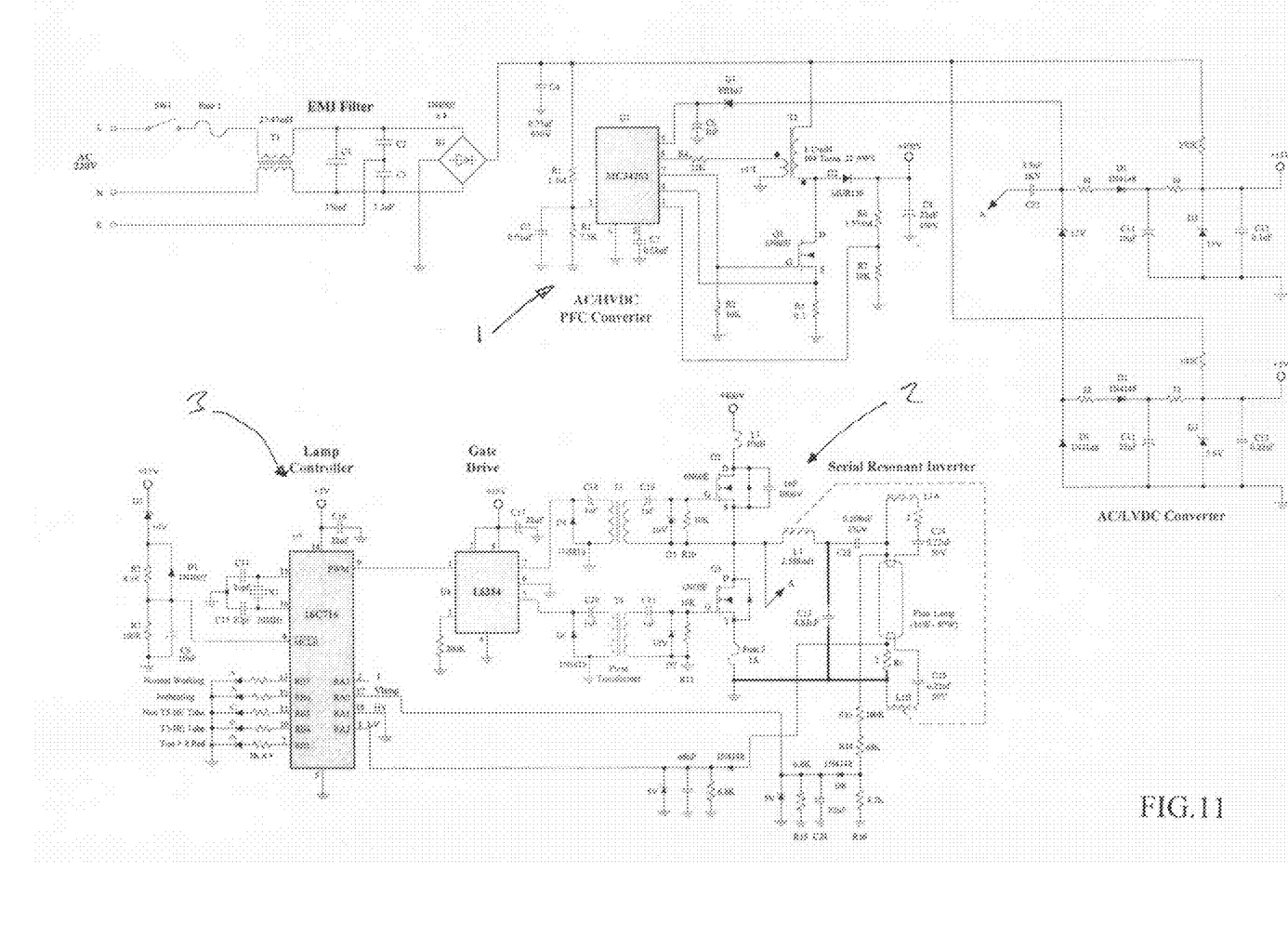
FIG. 11 shows the electrical circuit of a Universal Electronic Ballast embodying an embodiment of the invention.

FIG. 11 shows a schematic circuit diagram for one example of a Universal Electronic Ballast suitable for implanting an embodiment of the invention. The circuit includes a power factor converter (PFC) circuit 1 that uses a filtered AC source to provide the high and low DC voltage supplies for the remainder of the system (for example it may provide a 400V DC voltage for the power resonant inverter 2 for driving the lamp and other low-voltage power supplies for the electronic control integrated circuits and the microcontroller 3.

The ballast also includes a lamp voltage, current and filament resistor sensing circuit 4, which provides feedback signals for the microcontroller 3 which implements the fuzzy control algorithm as discussed above.

In particular, the first AC-DC circuit is used to provide the required low and high voltage dc supplies for the microcontroller, control and gate drive circuits (low-voltage) and the power inverter (high voltage). The power inverter turns the high-voltage dc power supply into a variable-frequency high-voltage ac voltage for driving the lamp. The sensing circuit provides the feedbacks of (a) lamp voltage, (b) hot filament resistance (before ignition) and (c) the lamp current for the microcontroller.

Lamp voltage detection id achieved using the potential divider consisting of R13, R14 and R16 and a peak voltage detector consisting of D8, C24 and R15, the rectified step-down version of the lamp voltage is obtained. Such signal is fed to the microcontroller as "Vlamp" in pin 17 of the microcontroller. For detecting the filament resistance, the close circuit consisting of the secondary winding L1B, a capacitor C25 and an external resistor Re can be used. Since the ac voltage across the secondary winding L1B is known in the design process and the current within this filament circuit can be measured from the voltage-drop across Re, the filament resistance inside the lamp can be obtained indirectly by solving the circuit equation. Because the hot filament resistance is measured before the lamp ignition, the current measured from the voltage across the external resistor Re represents the filament current only because there is no lamp arc current. The voltage across the Re is fed to the microcontroller as "LV". Before lamp ignition, signal LV will be used to estimate the filament resistance. After lamp ignition, the lamp current becomes the dominant current sensed by the external resistor Re. The signal LV will be used by the microcontroller to calculate the lamp current.

The invention claimed is:

1. A method of detecting a fluorescent lamp type from a number of known lamp types, comprising the steps of:
    (a) injecting a preheat current into the lamp filament,
    (b) detecting the resistance of the filament,
    (c) making a first determination of possible lamp type on the basis of the filament resistance,
    (d) if the determination in step (c) is not definitive measuring the lamp voltage,
    (e) making a second determination of possible lamp types on the basis of the filament resistance and the lamp voltage,
    (f) if the determination in step (e) is not definitive measuring the lamp current, and
    (g) making a third determination on the basis of the filament resistance, lamp voltage and lamp current.

2. A method as claimed in claim 1 wherein said preheat current in step (a) is injected for 1.5 to 3 seconds.

3. A method as claimed in claim 1 wherein the filament resistance is determined by providing a close circuit consisting of a second winding, a capacitor and an external resistor, determining the voltage drop across the external resistor, and obtaining the filament resistance by solving the circuit equation.

4. A method as claimed in claim 1 wherein prior to step (f) the lamp is operated for a period of time sufficient for the lamp to reach a steady-state condition and when in said steady-state condition the lamp voltage is determined and a decision is made as to whether the lamp is of a high-voltage or low-voltage type.

5. A method as claimed in claim 4 wherein said lamp is operated at 31 kHz for 90 seconds to reach said steady-state condition.

6. A method as claimed in claim 1 wherein said determinations of steps (c), (e) and (g) are carried out by comparing said measured values with reference values for various lamp types.

7. A method as claimed in claim 6 wherein said method is carried out by a control means, and wherein said reference values are stored in a database accessible by said control means.

8. A method as claimed in claim 7 wherein said filament resistance if converted to a voltage before being input to said control means.

9. A method as claimed in claim 7 wherein said lamp voltage is down-converted before being input to said control means.

10. An electronic ballast for a fluorescent lamp capable of detecting a fluorescent lamp type from a number of known lamp types, comprising:
 (a) means for injecting a preheat current into the lamp filament,
 (b) means for detecting the resistance of the filament,
 (c) means for making a first determination of possible lamp type on the basis of the filament resistance,
 (d) means for measuring the lamp voltage,
 (e) means for making a determination of possible lamp types on the basis of the filament resistance and the lamp voltage,
 (f) means for measures the lamp current, and
 (g) means for making a determination on the basis of the filament resistance, lamp voltage and lamp current.

* * * * *